(12) United States Patent
MacCurdy et al.

(10) Patent No.: US 9,487,387 B2
(45) Date of Patent: Nov. 8, 2016

(54) SYSTEM AND METHODS FOR ACTUATION USING ELECTRO-OSMOSIS

(71) Applicant: Cornell University, Ithaca, NY (US)

(72) Inventors: Robert MacCurdy, Ithaca, NY (US); Hod Lipson, New York, NY (US)

(73) Assignee: Cornell University, Ithaca, NY (US)

( * ) Notice: Subject to any disclaimer, the term of this patent is extended or adjusted under 35 U.S.C. 154(b) by 84 days.

(21) Appl. No.: 14/422,654

(22) PCT Filed: Aug. 20, 2013

(86) PCT No.: PCT/US2013/055714
§ 371 (c)(1),
(2) Date: Feb. 19, 2015

(87) PCT Pub. No.: WO2014/031596
PCT Pub. Date: Feb. 27, 2014

(65) Prior Publication Data
US 2015/0210534 A1    Jul. 30, 2015

Related U.S. Application Data

(60) Provisional application No. 61/691,025, filed on Aug. 20, 2012.

(51) Int. Cl.
| | |
|---|---|
| *B81B 5/00* | (2006.01) |
| *B81B 3/00* | (2006.01) |
| *B01D 61/42* | (2006.01) |
| *B01L 3/00* | (2006.01) |
| *F25B 41/02* | (2006.01) |

(52) U.S. Cl.
CPC .......... *B81B 3/0021* (2013.01); *B01D 61/427* (2013.01); *B01L 3/502746* (2013.01); *B81B 5/00* (2013.01); *B81B 2201/0214* (2013.01);*B81B2201/058* (2013.01); *B81B 2203/04* (2013.01); *B81B 2203/06* (2013.01); *F25B 41/02* (2013.01)

(58) Field of Classification Search
CPC . B81B 3/0021; B81B 3/502746; B81B 5/00; B81B 2201/058; B81B 2201/0214; B81B 2203/06; B81B 2203/04; B01D 61/427; F25B 41/02
See application file for complete search history.

(56) References Cited

U.S. PATENT DOCUMENTS

| | | | |
|---|---|---|---|
| 7,086,839 B2 | 8/2006 | Kenny et al. | |
| 7,362,032 B2 | 4/2008 | Pelrine et al. | |
| 7,867,592 B2 * | 1/2011 | Nelson ................. | B01D 61/427 428/40.1 |
| 2007/0021735 A1 | 1/2007 | Bhavaraju et al. | |

FOREIGN PATENT DOCUMENTS

WO         2012015115 A1    2/2012

OTHER PUBLICATIONS

Piyasena, M. et al., "Electroosmotically driven microfluidic actuators", Sensors and Actuators, 2009.

* cited by examiner

*Primary Examiner* — Arun S Phasge
(74) *Attorney, Agent, or Firm* — Valauskas Corder LLC

(57) ABSTRACT

The invention exploits a widely used device in microfluidics, the electro-osmotic pump (EOP), to create very low energy micro-scale and macro-scale mechanical actuators. The EOP uses electrical fields to move naturally occurring charged particles (ions) through a fluid medium. As the ions move in response to the applied field, they drag the (non-charged) fluid along, establishing bulk flow. When confined to a narrow chamber, a pressure gradient can be established. The combination of pressure gradient and flow performs mechanical work. With the use of electro-osmotic pumps, the invention enables actuators to be constructed in a variety of embodiments, including for example, a sheet structure, a piston structure, and a cellular structure to name a few.

12 Claims, 4 Drawing Sheets

SYSTEM AND METHODS FOR ACTUATION USING ELECTRO-OSMOSIS

PRIORITY CLAIM

This application claims the benefit of U.S. Provisional Patent Application Ser. No. 61/691,025 filed Aug. 20, 2012.

FIELD OF THE INVENTION

The invention relates generally to micro-fluidics and more specifically to a system and methods for creating very low energy micro-scale and macro-scale mechanical actuators through use of one or more electro-osmotic pumps.

BACKGROUND OF THE INVENTION

Most conventional mechanical pumps have issues with reliability due, in part, to the moving components. However, pumps that do not require moving components such as electro-osmotic pumps (EOPs) make them suitable for a variety of applications, including for example "lab-on-a-chip" devices, diagnostic devices, micro total analysis systems (µMTAS), drug delivery systems, and separation and mixing processes, as well as micro-processor cooling systems, to name a few.

Electro-osmosis is used to pump fluids that contain some quantity of charged species, such as positive and negative ions. An electric double layer is a structure that appears on the surface of an object when it is exposed to a fluid. The object might be a solid particle, a gas bubble, a liquid droplet, or a porous body. The electric double layer refers to two parallel layers of charge surrounding the object. The first layer comprises ions adsorbed onto the object due to chemical interactions. The second layer is composed of ions attracted to the surface charge. This second layer is loosely associated with the object. It is made of free ions that move in the fluid under the influence of electric attraction.

Most solid surfaces acquire a surface electric charge when brought into contact with a liquid. When an electric field is applied across the liquid, the ions in the double-layer migrate in the field, which results in viscous drag to create bulk fluid flow and generation of a net pressure. This effect is referred to as electro-osmosic pumping, or EOP pumping. Specifically, EOPs provide fluid flow due to movement of an electric double layer that forms at the solid-liquid interface. Not only do EOPs eliminate moving components, but EOPs also move fluid using the electric field. EOPs can move low conductivity fluids and have a greater pressure and flow rate change when compared to conventional pumps.

Thus, there is a need for low energy mechanical actuators that are of a simple design and construction. The invention satisfies this need.

SUMMARY OF THE INVENTION

The invention exploits a widely used device in micro-fluidics, the electro-osmotic pump (EOP), to create very low energy micro-scale and macro-scale mechanical actuators. The EOP uses electrical fields to move naturally occurring charged particles (ions) through a fluid medium. As the ions move in response to the applied field, they drag the (non-charged) fluid along, establishing bulk flow. When confined to a narrow chamber, a pressure gradient can be established. The combination of pressure gradient and bulk flow performs mechanical work, for example, fluid flow control (i.e. actuators, valves), linear actuators (e.g. for artificial muscles), micro-electro-mechanical system (MEMS) devices (e.g. micro-pistons in bulk silicon), and quasi-sealed actuators that expand and contract to realize both linear and bending motion.

The invention relies on individual micro-scale actuators that can be combined in any number including to produce a macro-scale actuator structure with better power density, increased reliability and lower production cost. With the use of electro-osmotic pumps, the invention enables actuators to be constructed in a variety of embodiments, including for example, a sheet structure, a piston structure, and a cellular structure, to name a few.

When compared to the small number of other efforts that have applied electro-osmotic pumping to actuation, the invention improves on these efforts in two key areas: (1) production of linear strain that can be scaled down for micro-actuators and scaled up for macro-actuators, and (2) mass-production using commercially available processes that is also cost-effective.

When compared to other types of hydraulic actuation, the invention yields high-force, high-strain linear and rotary actuators that are cheap to produce, and are at least an order of magnitude more efficient. These actuators are extremely valuable to the robotics community, since power generation and storage is one of the key limiting factors for the performance of mobile robots. However, these actuators are general purpose and can be applied to any area in which low cost and energy efficiency are priorities.

Certain embodiments of the invention are particularly suited to cost-sensitive areas, since they are intended to be produced with a very high-volume reel-to-reel production technique that reduces the individual component cost. Certain other embodiments are intended to be the actuation building block for a new paradigm of modular micro-machines. One goal is to provide a small set of micro-fabricated modular building blocks that form the basis for larger, more complex machines. The key different building block types include computation, power storage and transmission, structure, and actuation. Large numbers of these standardized building blocks may be prefabricated to establish the building blocks in specific locations in order to build an actuator assembly.

Certain other embodiments of the invention integrate a plurality of electro-osmotic pumps within a flexible material in order to provide an actuator with uniquely controllable states. For example, certain portions of the actuator can be curled up or curled down while maintaining a somewhat rigid state while other portions of the actuator can be soft and pliable. Therefore, actuators of this embodiment enable low or zero-power rigid portions.

Certain other embodiments may be of a more complex structure by incorporating an inherently three-dimensional (3D) mechanism so that the electro-osmotic pumps can move fluid vertically.

Specifically, the invention constructs micro-actuators that require very few moving parts, which is far more efficient than other hydraulic actuators, vastly simplifies the actuator design relative to other micro-actuators, offers large force output, and can be readily scaled to create macro-scale actuators that are composed of millions of individual actuators.

Some advantages of the invention include, for example, the creation of high efficiency actuators with a very low energy requirement, actuators of simple design with very few moving parts, actuators that can exude a large force output, and actuators that are readily scalable from micro-scale to macro-scale actuators.

The present invention and its attributes and advantages may be further understood and appreciated with reference to the detailed description below of contemplated embodiments, taken in conjunction with the accompanying drawings.

DESCRIPTION OF THE DRAWING

The accompanying drawings, which are incorporated in and constitute a part of this specification, illustrate an implementation of the invention and, together with the description, serve to explain the advantages and principles of the invention.

DETAILED DESCRIPTION OF THE INVENTION

All electro-osmotic pumps exploit the natural equilibrium-state distribution of ions at a fluid/solid interface. This distribution, known as the electrical double layer, results in a net charge on the solid and an equal, but opposite, net charge in the fluid near the surface of the solid. This charged fluid can be moved when an externally applied electric field is applied.

For exemplary purposes, the invention is discussed with respect to three embodiments: a sheet structure, a piston structure, and a cellular structure. However, it should be noted that the invention is not limited to these three embodiments, but that electro-osmotic pumps can be used to construct actuators in a variety of embodiments.

Figure 1:
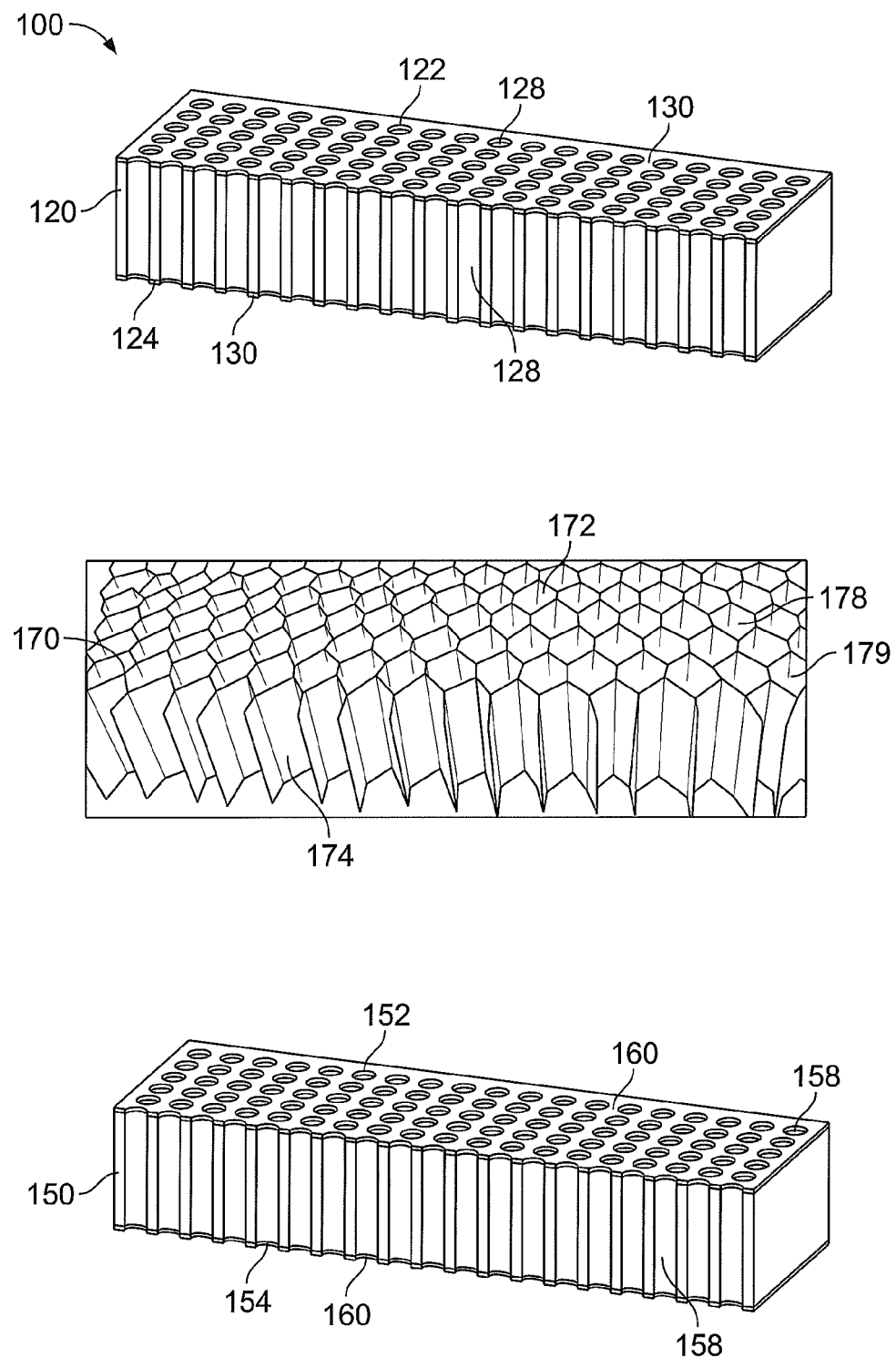
FIG. 1 illustrates an exploded view of one embodiment of an actuator in the form of a sheet structure according to the invention.
Figure 2:
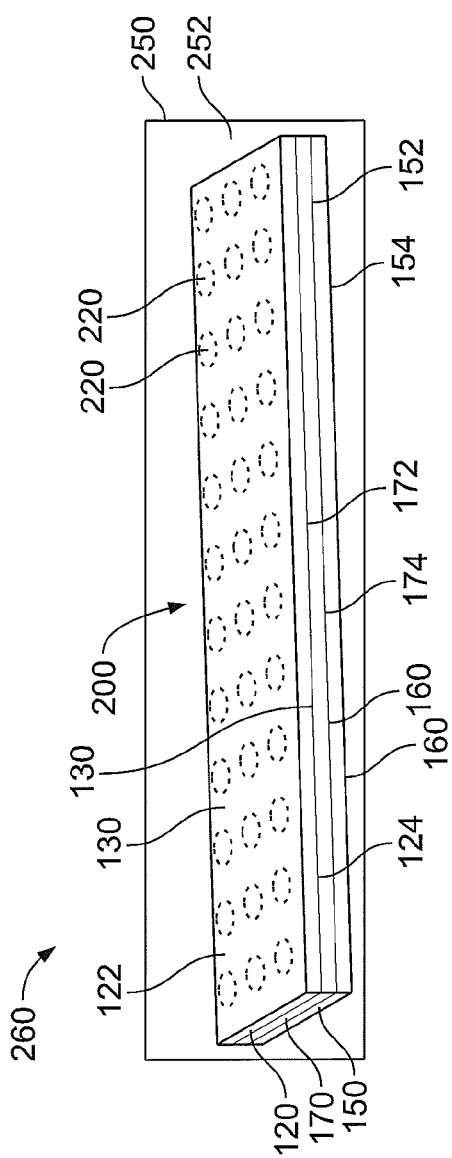
FIG. 2 illustrates the actuator of FIG. 1 in a relaxed state according to the invention.
Figure 3:
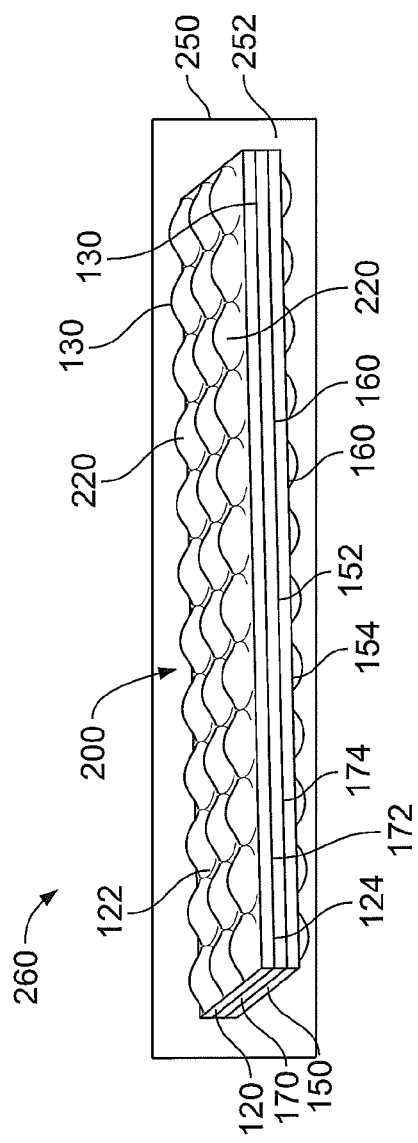
FIG. 3 illustrates the actuator of FIG. 1 in a contracted state according to the invention.

In one embodiment of the invention, the actuator is in the form of a sheet structure as shown in FIG. 1 through FIG. 3. FIG. 1 illustrates an exploded view of one embodiment of an actuator in the form of a sheet structure 100 according to the invention. The sheet structure 100 comprises a plurality of sheets—three sheets 120, 150, 170 as shown in FIG. 1 through FIG. 3; however, any number of sheets are contemplated. Each sheet 120, 150, 170 are constructed from a flexible, inelastic material such as a polymer.

The first flexible sheet 120 includes a first top side 122 and a first bottom side 124. The first top side 122 and the first bottom side 124 are coated with a first conductive layer 130 and the first flexible sheet 120 comprises a plurality of first chambers 128.

The second flexible sheet 150 includes a second top side 152 and a second bottom side 154. The second top side 152 and the second bottom side 154 are coated with a second conductive layer 160. Like the first flexible sheet 120, the second flexible sheet 150 comprises a plurality of second chambers 158.

A third flexible sheet 170 includes a third top side 172 and a third bottom side 174, wherein the third flexible sheet 170 comprises a plurality of third chambers 178 of a honeycomb arrangement 179.

As shown in FIG. 2, the second top side 152 of the second flexible sheet 150 is fused to the third bottom side 174 of the third flexible sheet 170 at a plurality of regular intervals and the first bottom side 124 of the first flexible sheet 120 is fused to the third top side 172 of the third flexible sheet 170 at a plurality of regular intervals to obtain an assembled flexible sheet structure 200 including a plurality of assembled chambers 220.

Each of the sheets 120, 150, 170 as shown in FIG. 1 can be mass produced as a rolled sheet. The assembled flexible sheet structure 200 is then formed using a reel to reel process that fuses the sheets 120, 150, 170 together at specific locations using heat and pressure in order to produce specific chambers 220.

The assembled flexible sheet structure 200 is positioned inside an outer membrane 250 that includes a working fluid 252 to form an actuator 260.

For purposes of this application, a working fluid is any gas or liquid that actuates the actuator. Examples of working fluids include for example, water, steam, pentane, toluene, chlorofluorocarbons, hydro-chlorofluorocarbons, fluorocarbons, propane, butane, isobutene, ammonia, sulfur dioxide, helium, etc.

As shown in FIG. 2 and FIG. 3, the assembled flexible sheet structure 200 contracts and expands to form a linear actuator when a voltage is applied to pump the working fluid 252 across the assembled flexible sheet structure 200 and into the plurality of assembled chambers 220.

More specifically, the conductive layer 130, 160 enables a charge to be externally applied. When opposite charges are applied to the assembled flexible sheet structure 200—specifically the conductive layers 130, 160—the working fluid 252 is forced through the assembled chambers 220 and swells the chambers 220 formed by the third flexible sheet 170 as shown in FIG. 3.

In one embodiment, it is contemplated that the chambers 220 range from 200 nanometers to several micrometers, depending on the design goals and the working fluid 252. In addition, it is contemplated that the chambers 220 may be approximately one millimeter in each planar dimension with the entire assembled flexible sheet structure 200 being several hundred micrometers thick. Again, these dimensions are not fixed and can be easily changed depending on the specific goals. In general however, a typical sheet structure actuator can employ hundreds of thousands to millions of individual chambers in a single sheet. For example, using the approximate chamber dimensions previously provided, a sheet structure actuator 10 centimeters long that employs a rolled sheet of chambers that is 10 centimeters long before being rolled would contain over 100,000 individual chambers.

FIG. 2 illustrates the actuator 260 in a relaxed state whereas FIG. 3 illustrates the actuator 260 in a contracted state according to the invention. As shown in FIG. 3, the swelling of chambers 220 stretches the flexible, inelastic sheets 120, 150, causing a contraction. This motion can be exploited to create low cost, batch-fabricated linear actuators such as artificial muscles.

Figure 4:
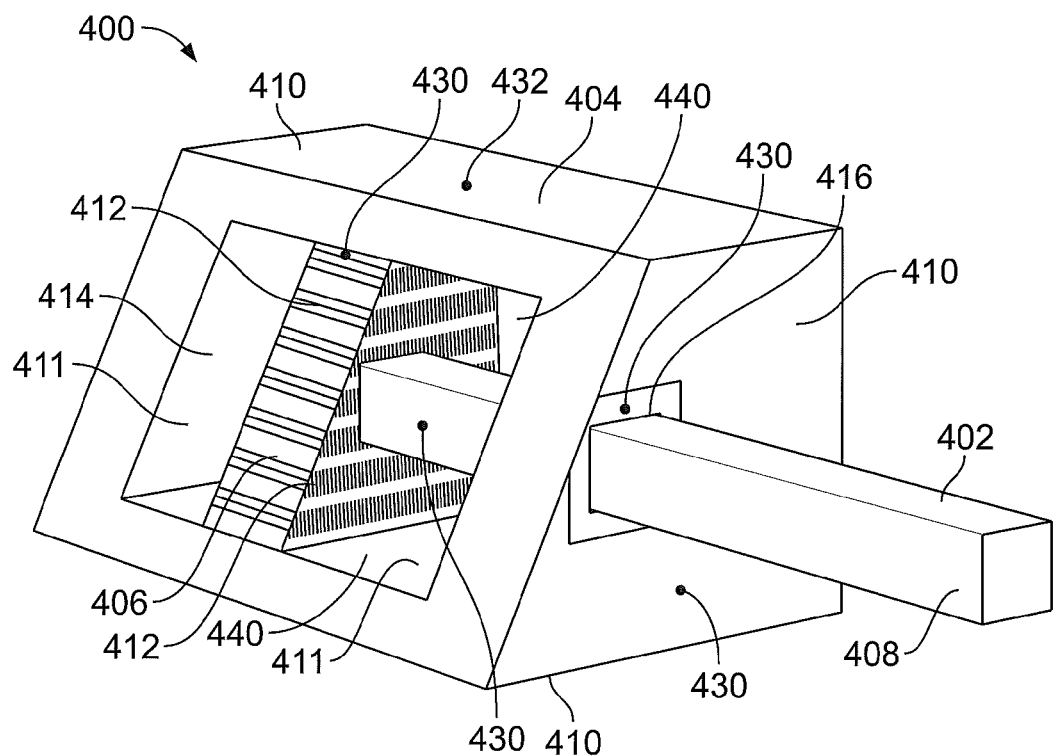
FIG. 4 illustrates a cross-section of another embodiment of an actuator in the form of a piston structure according to the invention.

In another embodiment of the invention, the actuator is in the form of a piston structure as shown in FIG. 4. In the piston structure embodiment, the electro-osmotic pumps perform two distinct functions: (1) pumping and (2) sealing. The pumping function moves fluid from one side of the piston to the other, forcing the piston to move. The sealing function prevents fluid from slipping past the piston (between the piston and the chamber wall) without also forcing the piston to move.

The piston structure according to the invention employs widely used micro-fabrication techniques to create micro-pistons in bulk silicon. This design yields high actuator force with low actuation power, and exploits the electro-osmotic pump to avoid complex seals at the pump/fluid boundaries.

In this piston structure embodiment, the invention is intended to be implemented in traditional microelectromechanical systems (MEMS) setting using bulk silicon and various etch and plate stages.

The piston structure actuator 400 comprises a piston 402 positioned within an enclosed chamber 404. Specifically, the piston 402 includes a head 406 and a cylinder 408. The enclosed chamber 404 includes a plurality of outside surfaces 410 and a plurality of inside surfaces 411. The head 406 of the piston 402 includes a plurality of perforations 412.

The enclosed chamber 404 is filled with a working fluid 414, wherein the enclosed chamber 404 includes an aperture 416 through which the piston 402 is positioned within the enclosed chamber 404.

The piston structure actuator 400 includes one or more electrodes 430. In one embodiment, the one or more electrodes 430 are positioned on either side of one or more perforations 412 of the head 406. In another embodiment, the one or more electrodes 430 are positioned at two opposing outside surfaces 410 of the enclosed chamber 404. In another embodiment, the one or more electrodes 430 are positioned at the aperture 416 of the enclosed chamber 404. It is further contemplated that one or more conductors 432 can be used to connect the one or more electrodes 430 to an outside surface 410 of the enclosed chamber 404.

In the embodiment with one or more electrodes 430 positioned at two opposing outside surfaces 410 of the enclosed chamber 404, a weaker electric field for the same applied voltage is realized, but this embodiment avoids the need for conductors 432 that connect the electrodes 430 on the piston 402 to the outside surface 410 of the chamber 404.

The one or more electrodes 430 are configured to be charged to create an electric field in order to move the working fluid 414 and actuate the piston 402. Specifically, when the one or more electrodes 430 are charged, the resulting electric field causes the working fluid 414 to flow from one insides surface 411 to another inside surface 411 of the enclosed chamber 404 causing the piston 402 to move.

More specifically, the pumping and sealing functions are both accomplished by the same electro-osmotic pump that uses the one or more electrodes 430 on the piston 402 itself, and is formed by the gap 440 between the cylinder 408 and an inside surface 411 of the chamber 404. When the electrodes 430 are energized, the working fluid 414 is forced to flow within the gap 440, causing a bulk flow of the working fluid 414 from one side of the piston 402 to the other. This approach avoids flexible seals which are difficult to fabricate and cause friction losses or stiction—the static friction that needs to be overcome to enable relative motion of stationary objects in contact.

It is also contemplated that a second electro-osmotic pump may be implemented, separate and apart from the piston structure actuator 400, that moves working fluid from one side of the piston to the other via microfluidic channels that lead to either side of the piston (these channels might lead to either end of the chamber, for example). This version is more complicated, but allows greater fluid pressures and flow rates.

Figure 5:
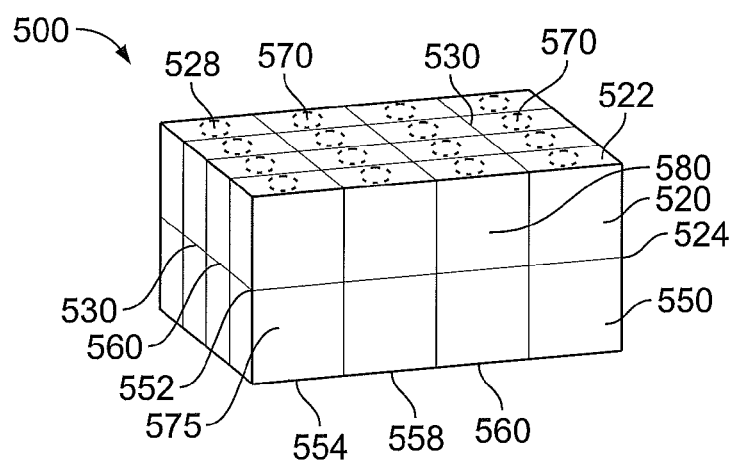
FIG. 5 illustrates another embodiment of an actuator in the form of a cellular structure according to the invention.
Figure 6:
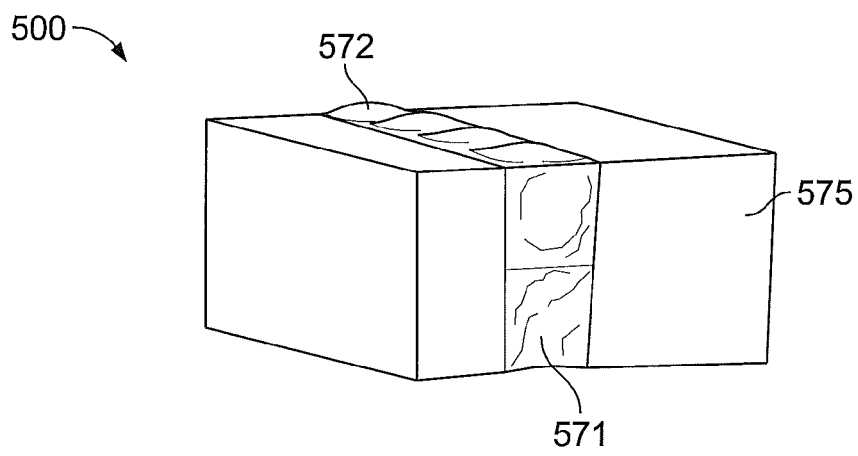
FIG. 6 illustrates the actuator of FIG. 6 with a portion actuated to bend slightly according to the invention.
Figure 7:
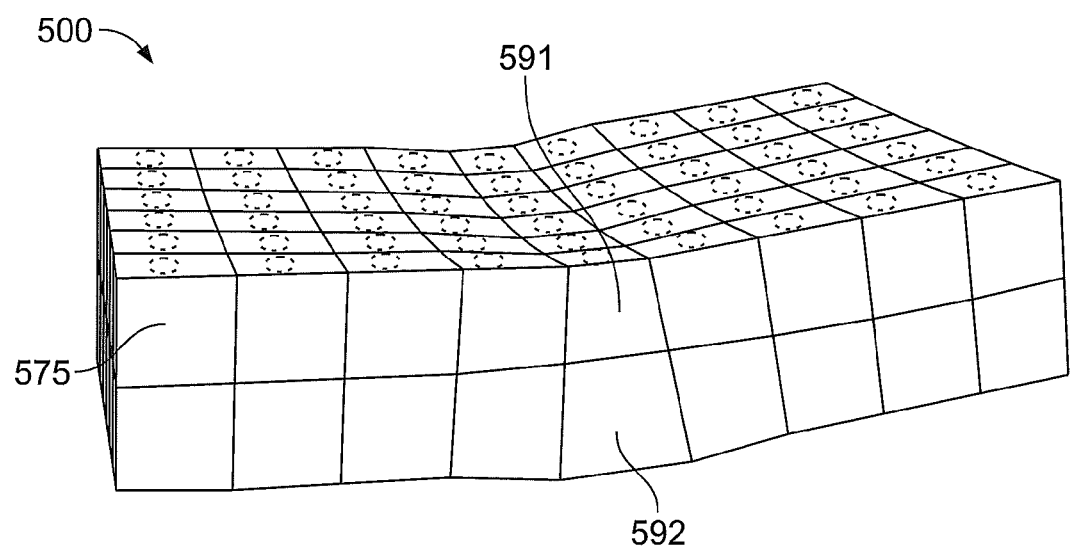
FIG. 7 illustrates the actuator of FIG. 6 with a portion actuated to curl upward according to the invention.

FIG. 5 through FIG. 7 illustrate another embodiment of an actuator in the form of a cellular structure 500 according to the invention. In this embodiment, the invention uses an array of identical chambers that are separated by individually addressable permeable layers. Rather than pumping the working fluid from outside the assembly as described in the embodiment of FIG. 1 through FIG. 3, it uses pumps that separate different cellular chambers to move the working fluid between chambers. This motion swells some chambers while shrinking others. Some of these chambers employ inelastic inner struts which bias the contraction/expansion due to fluid motion to cause non-isotropic expansion or contraction. This approach can yield actuators that are sealed, yet realize both linear and bending motion.

Similar to the first embodiment described in FIG. 1 through FIG. 3, the cellular structure 500 comprises a plurality of sheets 520, 550 that are constructed from a flexible, inelastic material such as a polymer.

The first flexible sheet 520 includes a first top side 522 and a first bottom side 524. The first top side 522 and the first bottom side 524 are coated with a first conductive layer 530 and the first flexible sheet 520 comprises a plurality of first chambers 528.

The second flexible sheet 550 includes a second top side 552 and a second bottom side 554. The second top side 552 and the second bottom side 554 are coated with a second conductive layer 560. Like the first flexible sheet 520, the second flexible sheet 550 comprises a plurality of second chambers 558.

As shown in FIG. 5, the second top side 552 of the second flexible sheet 550 is fused to the first bottom side 524 of the first flexible sheet 520 at a plurality of regular intervals to obtain an assembled flexible cellular structure 500 including a plurality of assembled chambers 570.

A working fluid 575 is positioned inside the flexible cellular structure 500 to create the mechanical actuator, wherein the plurality of assembled chambers 570 are separated by individually addressable permeable layers 530, 560 such that voltage applied to one or more individually addressable permeable layers 530, 560 causes the working fluid 575 to flow from one assembled chamber 570 into an adjacent assembled chamber 570 such that select assembled chambers 570 of the plurality are configured to contract and expand. Furthermore, an inelastic inner strut 580 may be positioned within each assembled chamber 570 to bias the contraction and expansion of the chamber 570.

FIG. 6 illustrates the actuator of FIG. 6 with a portion actuated to bend slightly according to the invention. Working fluid 575 from four of the chambers 571 has been pumped into the four chambers 571 directly above them causing the chambers 571, 572 to swell or contract causing the entire assembled cellular structure 500 to bend.

FIG. 7 illustrates the actuator of FIG. 6 with a portion actuated to curl upward according to the invention. Working fluid 575 pumped from chamber 591 into the chamber 592, causing chamber 591 to contract and chamber 592 to swell, which causes the actuator in the form of a cellular structure 500 to curl upward. Specifically, the resulting tension draws the ends of the actuator together.

Similar to the other embodiments of the invention, the actuator in the form of a cellular structure 500 can be built on a reel-reel process. As shown two sheets are stacked; however, multiple sheets may be stacked in order to create a many-layer stack-up.

The described embodiments are to be considered in all respects only as illustrative and not restrictive, and the scope of the present invention is not limited to the foregoing description. Those of skill in the art may recognize changes, substitutions, adaptations and other modifications that may nonetheless come within the scope of the present invention and range of the present invention.

The invention claimed is:

1. A mechanical actuator, comprising
   a first flexible sheet including a first top side and a first bottom side, each side coated with a first conductive layer, the first flexible sheet comprising a plurality of first chambers;
   a second flexible sheet including a second top side and a second bottom side, each side coated with a second conductive layer, the second flexible sheet comprising a plurality of second chambers;
   a third flexible sheet including a third top side and a third bottom side, wherein the third flexible sheet comprises a plurality of third chambers of a honey-comb arrangement;
   the second top side of the second flexible sheet is fused to the third bottom side of the third flexible sheet at a plurality of regular intervals and the first bottom side of the first flexible sheet is fused to the third top side of the third flexible sheet at a plurality of regular intervals to obtain an assembled flexible sheet structure including a plurality of assembled chambers;
   an outer membrane including a working fluid, wherein the assembled flexible sheet structure is positioned inside the outer membrane to create the mechanical actuator; and
   the assembled flexible sheet structure configured to contract and expand to form a linear actuator when a voltage is applied to pump the working fluid across the assembled flexible sheet structure and into the plurality of assembled chambers.

2. The mechanical actuator of claim 1, wherein the first flexible sheet and the second flexible sheet are fabricated from a polymer.

3. The mechanical actuator of claim 1, wherein the plurality of assembled chambers are separated by individually addressable permeable conductive layers such that voltage applied to one or more individually addressable permeable layers causes the working fluid to flow from one chamber into an adjacent chamber.

4. The mechanical actuator of claim 3 further comprising an inelastic inner strut positioned within each chamber to bias the contraction and expansion of the chamber.

5. A mechanical actuator, comprising:
   a piston including a cylinder and a head with a plurality of perforations;
   an enclosed chamber filled with a working fluid, wherein the enclosed chamber includes an aperture through which the piston is positioned within the enclosed chamber;
   one or more electrodes on the piston, wherein the one or more electrodes are configured to be charged to create an electric field in order to move the working fluid and actuate the piston.

6. The mechanical actuator of claim 5, wherein the one or more electrodes are positioned on either side of one or more perforations of the plurality of perforations.

7. The mechanical actuator of claim 6 further comprising one or more conductors that connect the one or more electrodes to an outside surface of the enclosed chamber.

8. The mechanical actuator of claim 5, wherein the one or more electrodes are positioned at two opposing outside surfaces of the enclosed chamber.

9. The mechanical actuator of claim 5, further comprising one or more second electrodes positioned at the aperture of the enclosed chamber.

10. A mechanical actuator, comprising
    a first flexible sheet including a first top side and a first bottom side, each side coated with a first conductive layer, the first flexible sheet comprising a plurality of first chambers;
    a second flexible sheet including a second top side and a second bottom side, each side coated with a second conductive layer, the second flexible sheet comprising a plurality of second chambers;
    the second top side of the second flexible sheet is fused to the first bottom side of the first flexible sheet at a plurality of regular intervals to obtain an assembled flexible cellular structure including a plurality of assembled chambers;
    a working fluid positioned inside the flexible cellular structure to create the mechanical actuator, wherein the plurality of assembled chambers are separated by individually addressable permeable layers such that voltage applied to one or more individually addressable permeable layers causes the working fluid to flow from one chamber into an adjacent chamber such that select chambers of the plurality are configured to contract and expand.

11. The mechanical actuator of claim 10, wherein the first flexible sheet and the second flexible sheet are fabricated from a polymer.

12. The mechanical actuator of claim 10 further comprising an inelastic inner strut positioned within each chamber to bias the contraction and expansion of the chamber.

* * * * *